United States Patent
Sasaki et al.

(10) Patent No.: US 7,496,875 B2
(45) Date of Patent: Feb. 24, 2009

(54) DESIGNING METHOD FOR DESIGNING ELECTRONIC COMPONENT

(75) Inventors: Yukinori Sasaki, Hyogo (JP); Mamoru Ito, Hyogo (JP)

(73) Assignee: Panasonic Corporation, Osaka (JP)

(*) Notice: Subject to any disclaimer, the term of this patent is extended or adjusted under 35 U.S.C. 154(b) by 120 days.

(21) Appl. No.: 11/629,909

(22) PCT Filed: Apr. 11, 2006

(86) PCT No.: PCT/JP2006/307612

§ 371 (c)(1),
(2), (4) Date: Dec. 18, 2006

(87) PCT Pub. No.: WO2006/109785

PCT Pub. Date: Oct. 19, 2006

(65) Prior Publication Data

US 2008/0028348 A1    Jan. 31, 2008

(30) Foreign Application Priority Data

Apr. 12, 2005   (JP) .............................. 2005-114144

(51) Int. Cl.
*G06F 17/50* (2006.01)
(52) U.S. Cl. ................ 716/5; 716/1; 716/7; 716/10
(58) Field of Classification Search ............... 716/1, 716/7, 10, 5
See application file for complete search history.

(56) References Cited

U.S. PATENT DOCUMENTS

| | | | | |
|---|---|---|---|---|
| 5,544,067 | A | * | 8/1996 | Rostoker et al. ............. 703/14 |
| 2002/0069395 | A1 | * | 6/2002 | Fujiwara et al. ................ 716/4 |
| 2004/0207487 | A1 | | 10/2004 | Hayashi |
| 2006/0265677 | A1 | * | 11/2006 | Scheffer et al. ................ 716/5 |

FOREIGN PATENT DOCUMENTS

| | | |
|---|---|---|
| JP | 6-163698 | 6/1994 |
| JP | 9-204451 | 8/1997 |
| JP | 11-066122 | 3/1999 |
| JP | 2002-073718 | 3/2002 |
| JP | 2003-016133 | 1/2003 |
| JP | 2005-026312 | 1/2005 |

* cited by examiner

*Primary Examiner*—Sun J Lin
(74) *Attorney, Agent, or Firm*—Wenderoth, Lind & Ponack, L.L.P.

(57) ABSTRACT

A designing method for designing an electronic component aiming at increase in designing efficiency is provided. The designing method has a step of setting a predetermined electrical characteristic, a step of determining an electric constant of the component with a first electric circuit simulation to satisfy the predetermined electrical characteristic, a step of determining a pattern shape for obtaining the electric constant, a step of retrieving and selecting an electronic component matching with the electric constant from a database, and performing layout design using the selected electronic component as a module, a step of performing a second electric circuit simulation, and a step of determining whether the electrical characteristic of the module matches with the predetermined electrical characteristic.

7 Claims, 6 Drawing Sheets

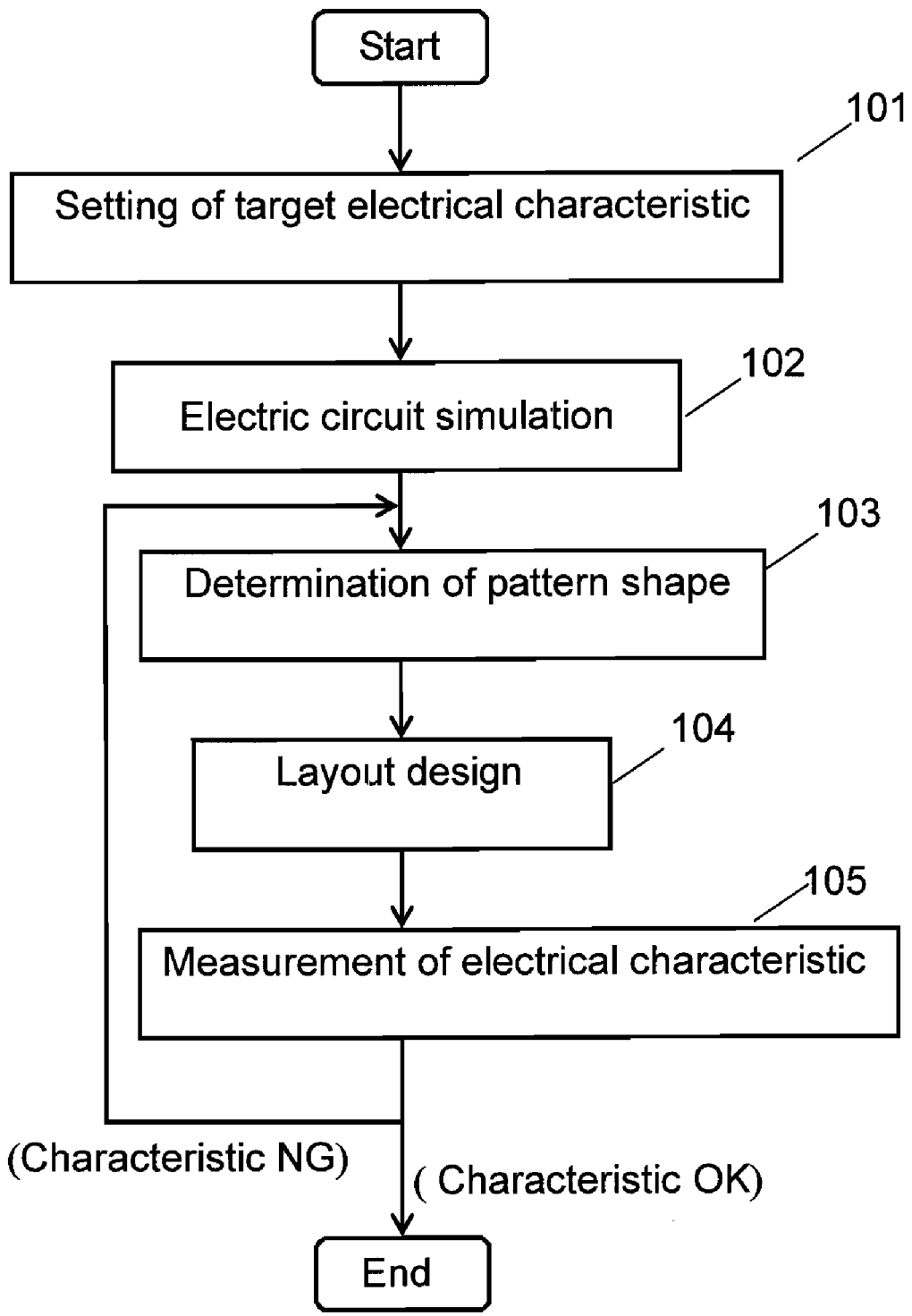
FIG. 7 – PRIOR ART

DESIGNING METHOD FOR DESIGNING ELECTRONIC COMPONENT

TECHNICAL FIELD

The present invention relates to a designing method for designing an electronic component.

BACKGROUND ART

FIG. 7 shows a designing method for designing an electronic component, especially a flowchart using a CAD (computer-aided design) system. In starting the design of the electronic component, a predetermined electrical characteristic is determined in step 101. In step 102, electric constants of electrically equivalent circuits and the electronic components constituting them are determined by an electric circuit simulator or the like so that the electrical characteristic determined in step 101 satisfies a predetermined value. In step 103, physical shapes and conductive metal patterns of the electronic components or the like for achieving the electric constants determined in step 102 are determined.

Then, in step 104, based on the physical shapes of various electronic components determined in step 102, the electronic components or the like are laid out in a module, and wiring patterns between the electronic components and external terminals or the like are formed. In step 105, an electrical characteristic is measured, and it is determined whether or not the measured electrical characteristic matches with the predetermined electrical characteristic determined in step 101. When the predetermined electrical characteristic is not achieved, the process returns to step 103, and the processes of step 103 and later are repeated. When the predetermined electrical characteristic is achieved in step 105, all processes are completed.

In the conventional example, however, the designing efficiency is low. In the conventional configuration, the determination of the pattern shape of step 103 and layout design of step 104 have not yet been completed at the time of the electric circuit simulation of step 102, so that the electric circuit simulation considering the layout cannot be performed. Therefore, in the measurement stage of the electrical characteristic of step 105, frequently, the measured electrical characteristic does not match with the predetermined electrical characteristic. The simulation must therefore be repeated many times, and hence it is not easy to increase the designing efficiency. The electric circuit simulation of step 102 is performed by the electric circuit simulator, and the other steps are performed by a CAD system, so that the designing efficiency is not increased against expectations.

Conventional examples related to the present invention are disclosed in Japanese Patent Unexamined Publication No. 2003-16133 and Japanese Patent Unexamined Publication No. 2002-73718.

SUMMARY OF THE INVENTION

The present invention provides a designing method for designing an electronic component where the designing efficiency is increased. The designing method of the present invention additionally has a function of performing electric circuit simulation, and a step of performing the electric circuit simulation is added between the designing step of the layout and the measuring step of the electrical characteristic.

An electric circuit simulation considering the layout can be performed in this method, so that the problem that the simulation must be performed again can be solved. Since the electric circuit simulation is used as a function in the system, processing between systems can be avoided and the designing efficiency can be increased.

A specific designing method for designing an electronic component, according to the present invention, has the following steps:

a first step of setting a predetermined electrical characteristic;

a second step of determining an electric constant of the electronic component with a first electric circuit simulation to satisfy the predetermined electrical characteristic;

a third step of determining a physical pattern shape to obtain the electric constant of the electronic component;

a fourth step of retrieving and selecting an electronic component having the determined electric constant from a database, and performing layout design using the selected electronic component as a module;

a fifth step of performing a second electric circuit simulation after the fourth step of performing the layout design; and a sixth step of measuring the electrical characteristic of the module, and determining whether the measured electrical characteristic matches with the predetermined electrical characteristic.

In the designing method of the present invention, three-dimensional shape information and electrical characteristic of the electronic component are stored in the database.

In the designing method of the present invention, three-dimensional information on an allowable clearance is stored in the database. Here, the allowable clearance defines the layout interval between the electronic component and another electronic component that is adjacent to it when the electronic components are laid out.

In the designing method of the present invention, three-dimensional shape information on a wiring pattern and a via hole that connect the electronic component to other electronic components is stored in the database.

In the designing method of the present invention, the processes of the third step and later are performed after the fifth step.

In the designing method of the present invention, the processes of the third step and later are performed after the sixth step.

In the designing method of the present invention, the processes of the second, third, fourth, and fifth steps are performed by the same CAD system.

In the designing method of the present invention, the electronic component is formed on a low-temperature fired ceramic substrate.

In the designing method of the present invention, the electronic component includes at least one of a capacitor, an inductor, and a resistor.

In the designing method of the present invention, the low-temperature fired ceramic substrate is a multilayer circuit board.

BRIEF DESCRIPTION OF DRAWINGS

FIG. 7 is a flowchart showing a conventional module designing procedure.

DETAILED DESCRIPTION OF PREFERRED EMBODIMENTS

A designing method for designing an electronic component using a CAD system in accordance with an exemplary embodiment of the present invention will be described hereinafter with reference to the drawings.

Figure 1:
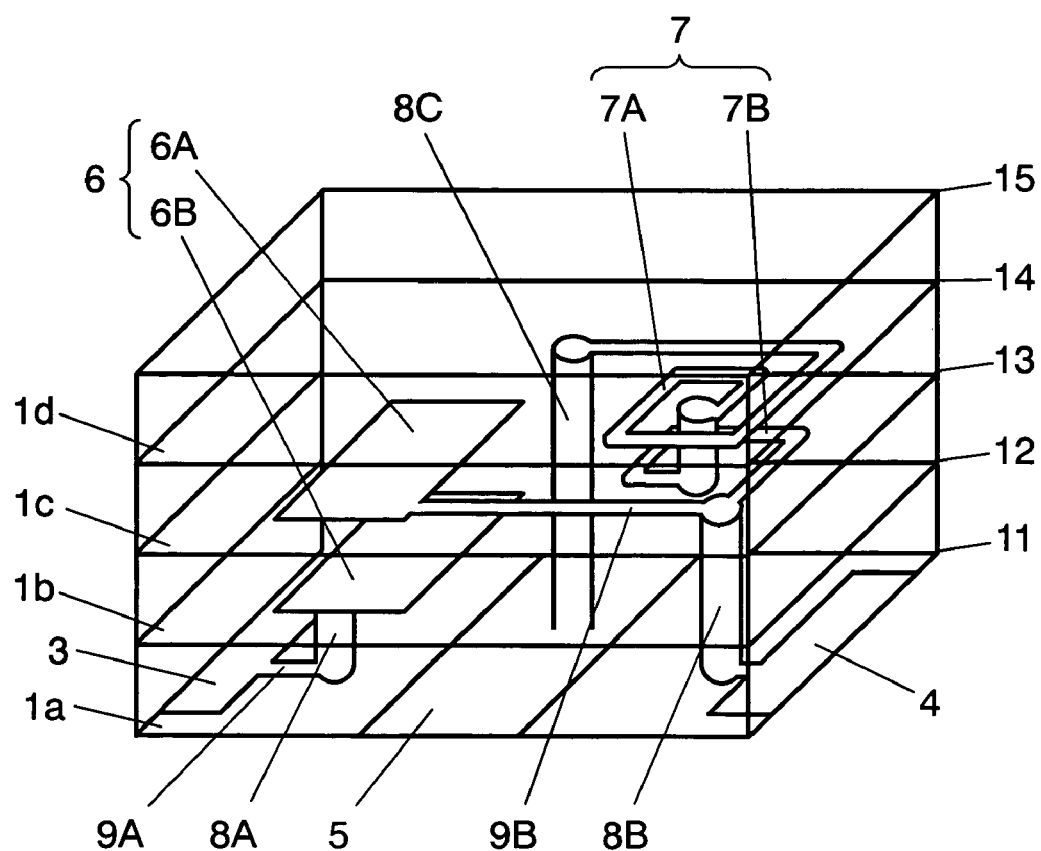
FIG. 1 is a see-through perspective view of a multilayer circuit component module in accordance with an exemplary embodiment of the present invention.

FIG. 1 is a see-through perspective view of a module using a low-temperature fired ceramic (hereinafter referred to as "LTCC") substrate that is employed as the electronic component. FIG. 1 illustrates a module employing four dielectric substrates 1a, 1b, 1c and 1d, for example. Conductive metal patterns made of copper or silver are formed between dielectric substrates 1a and 1b, between dielectric substrates 1b and 1c, and between dielectric substrates 1c and 1d. When the number of dielectric substrates 1a through 1d is four, for example, five pattern forming layers 11, 12, 13, 14 and 15 defining a pattern can be formed.

External terminal 3 for input is connected to capacitor unit region 6 having rectangular patterns 6A and 6B through wiring pattern 9A and via hole 8A, and then connected to branched wiring pattern 9B. One side of branched wiring pattern 9B is connected to external terminal 4 for output through via hole 8B. The other side of branched wiring pattern 9B is connected to inductor unit region 7, and then connected to external terminal 5 for installation through via hole 8C.

Figure 2:
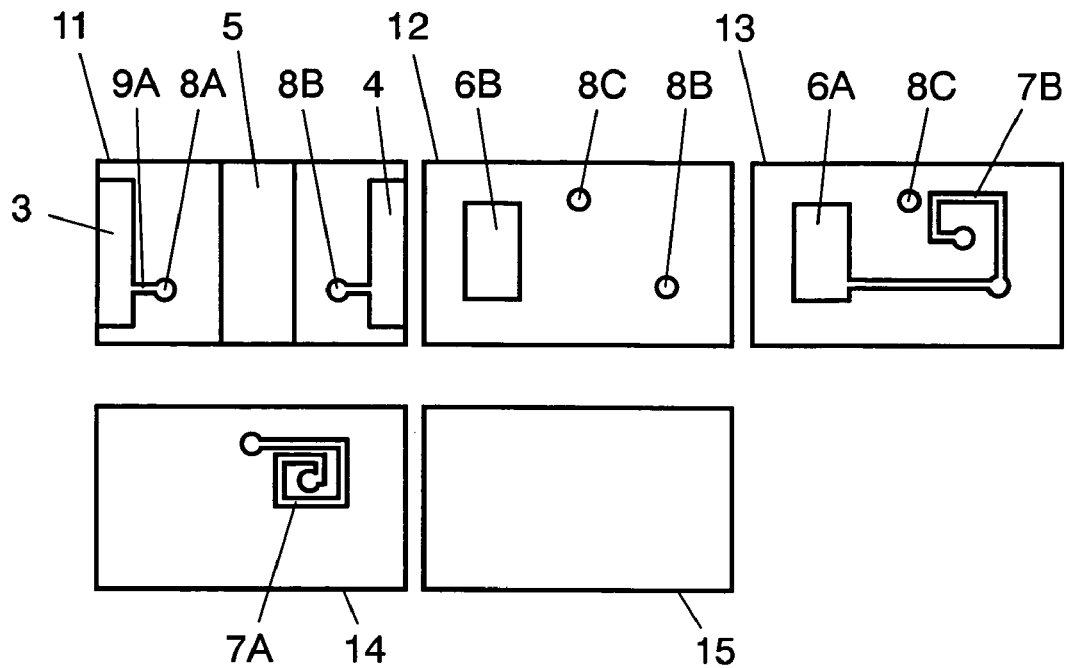
FIG. 2 is an expanded plan view of pattern forming layers in accordance with the exemplary embodiment.

FIG. 2 is an expanded plan view of pattern forming layers 11, 12, 13, 14 and 15 of FIG. 1. Elements the same as those used in FIG. 1 are denoted with the same reference marks. Pattern forming layer 11 has a pattern for the external terminal that is to be electrically connected to a terminal existing on a printed board mainly when the module is mounted to the printed board. Capacitor unit region 6 is formed of rectangular pattern 6B of pattern forming layer 12 and rectangular pattern 6A of pattern forming layer 13. In other words, rectangular patterns 6A and 6B are formed as electrode units of capacitor unit region 6.

Inductor unit 7 is formed of spiral pattern 7B of pattern forming layer 13 and spiral pattern 7A of pattern forming layer 14. No pattern is formed in outermost pattern forming layer 15. When a chip-shaped electronic component (not shown) is further mounted to the surface of the module, a pattern for connection for allowing electric connection to the chip-shaped electronic component may be formed in pattern forming layer 15.

Figure 3:
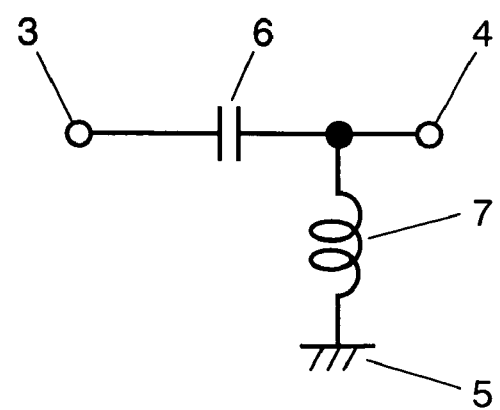
FIG. 3 is an electrically equivalent circuit diagram of the multilayer circuit component module in accordance with the exemplary embodiment.

FIG. 3 shows an electrically equivalent circuit formed based on the wiring information of FIG. 1 and FIG. 2. The configuration of the electric circuit of FIG. 3 has an electric circuit function as a high pass filter (so-called HPF). The high pass filter passes only power that has frequencies higher than a specific frequency, of power fed from external terminal 3 for input, to external terminal 4 for output.

Figure 4:
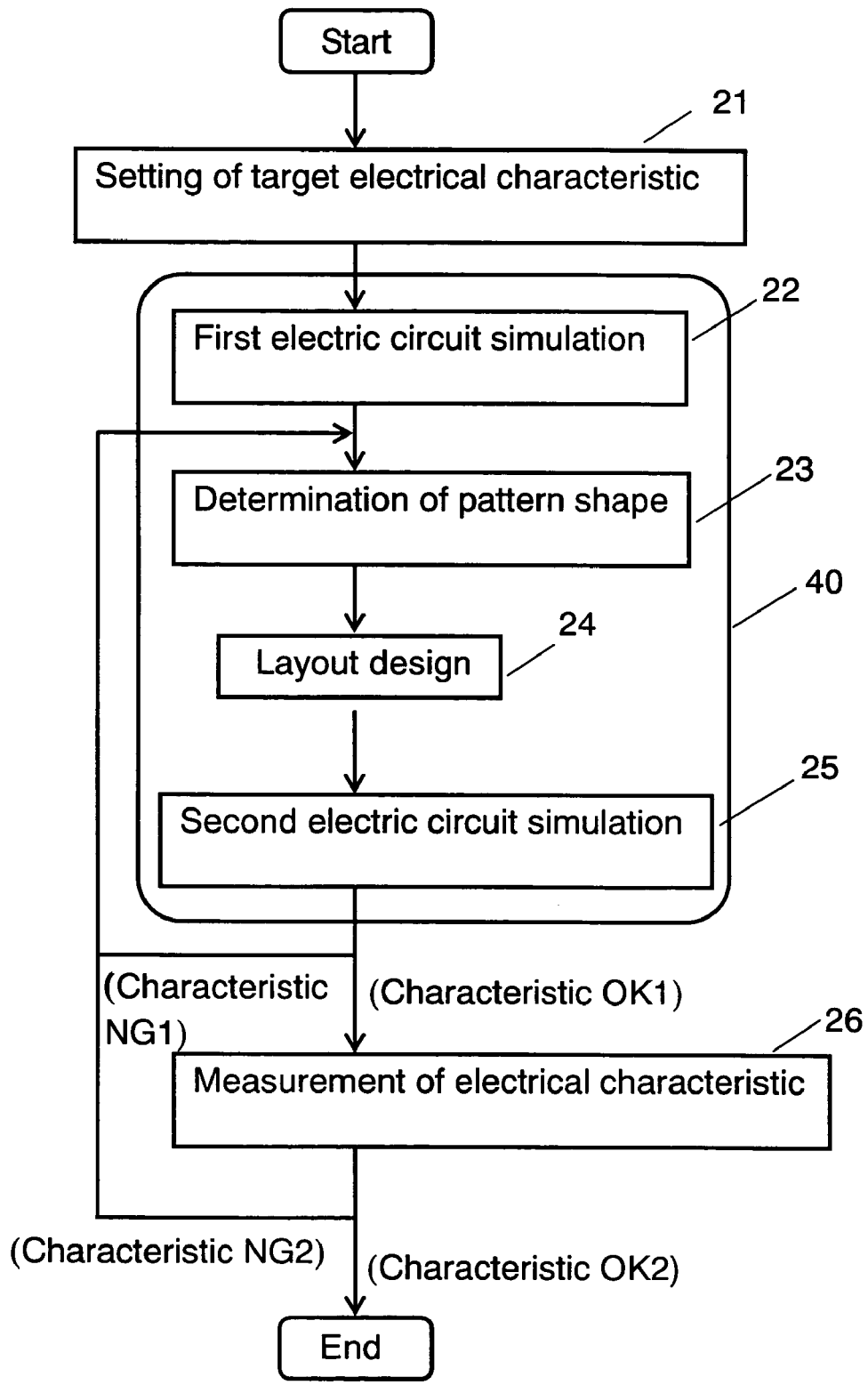
FIG. 4 is a flowchart showing a module designing procedure in accordance with the exemplary embodiment.

FIG. 4 is a flowchart used for designing the module employing such an LTCC substrate. In starting to design an electronic component, a predetermined electrical characteristic as a target is firstly determined in step 21. Here, the predetermined electrical characteristic may be a band width of a high-frequency filter or a cut-off frequency, for example. In step 22, for achieving the predetermined electrical characteristic, an electric constant of the module is determined by a first electric circuit simulation incorporated in CAD system 40. In step 23, for achieving the electrical characteristic determined in step 22, thickness of the LTCC substrate and a pattern shape of the conductive metal are determined.

Then, in step 24, layout design is performed. When the pattern formation and the layout design are performed using a mechanical three-dimensional CAD, the designing efficiency of a multilayer circuit component formed by integrating electronic component regions in a three-dimensional space can be increased. Here, the multilayer circuit component is a module using the LTCC substrate, for example.

In step 25, a second electric circuit simulation is performed in consideration of the number of via holes 8A, 8B and 8C and the length of wiring patterns 9A and 9B (FIG. 1). The second electric circuit simulation is also incorporated in CAD system 40. When the result of the second electric circuit simulation (step 25) does not match with a target electrical characteristic or largely separates from a predetermined range (characteristic NG1), for reducing these errors, the shape of the conductive metal pattern, the position of the electronic component region in the module, and the lengths and positions of the via holes and the wiring patterns are varied. For varying them, the process returns to step 23, and the processes of step 23 and later are performed. When the result of the second electric circuit simulation substantially matches with the predetermined electrical characteristic and is allowable in design (characteristic OK1), the process goes to step 26. In step 26, the electrical characteristic of an actually produced module is measured, and it is determined whether or not this electrical characteristic matches with the target electrical characteristic. When the predetermined electrical characteristic is obtained in step 26 (characteristic OK2), the design of the electronic component is completed. When the measured electrical characteristic is out of the predetermined allowable range, the processes of step 23 and later are performed again.

When the frequency band where the module employing the LTCC substrate is used is in a high frequency region, various parasitic components are apt to be added to capacitor unit region 6 or inductor unit region 7. Electromagnetic coupling is apt to occur in the electronic component region such as capacitor unit region 6 or inductor unit region 7, between via holes 8A, 8B and 8C, and between wiring patterns 9A and 9B. For obtaining the degree of the electromagnetic coupling and an accurate electrical characteristic, generally, an electromagnetic field simulator for solving a Maxwell equation based on the module configuration and electric boundary condition is used.

In the electromagnetic analysis, problems occur that more electronic components are generally required and the calculation time sharply increases with increase in circuit scale, though the occurrence depends on the method of the analysis. Therefore, when the electromagnetic analysis is incorporated into the designing procedure of the whole module, sufficient designing efficiency cannot be obtained. However, the method of the present invention where the electromagnetic analysis is applied to only a single electronic component region having a certain three-dimensional shape does not take much time. Here, the single electronic component region is capacitor unit region 6 or inductor unit region 7, for example. Therefore, the electrical characteristic corresponding to the electronic component region can be relatively easily obtained.

In the second electric circuit simulation of step 25, the electrical characteristics of capacitor unit region 6 and inductor unit region 7 are not calculated as concentrated constants of the capacity and inductance itself, but are calculated using the electrical characteristic that is obtained by electromagnetically analyzing the single electronic component region having the three-dimensional shape. Thus, the electrical characteristic can be simulated in consideration of effects of various parasitic components such as parasitic inductor and parasitic capacity of capacitor unit region 6 and inductor unit region 7, and accurate prediction of the electrical characteristic is allowed.

The result of the electromagnetic analysis of the certain single electronic component region can be stored as the three-dimensional shape information of the electronic component and a pair of electrical characteristic data corresponding to it. When such simulation is performed in various electronic component regions, the three-dimensional shape information of the electronic component and electrical characteristic data corresponding to it can be produced. In the stage of the first electric circuit simulation of step 22, it has not been determined which pattern shape of electronic component region is used. However, when the pattern shape is determined in step 22, and the three-dimensional shape information of the electronic component region that has the electrical characteristic closest to the predetermined electrical characteristic is automatically extracted from the database, the efficiency of the pattern shape determining procedure of step 23 is largely increased. Further, the efficiency of the layout designing procedure in step 24 can be largely increased by the following processes:

automatically extracting, from the database, the three-dimensional shape information of the electronic component region that has the electrical characteristic closest to the electrical characteristic required for layout design in step 24; and automatically laying out the information in a three-dimensional space in the module under various constraints such as minimizing the volume of the module or minimizing the whole length of wiring patterns 9A and 9B for electrically connecting the electronic component region.

Figure 5:
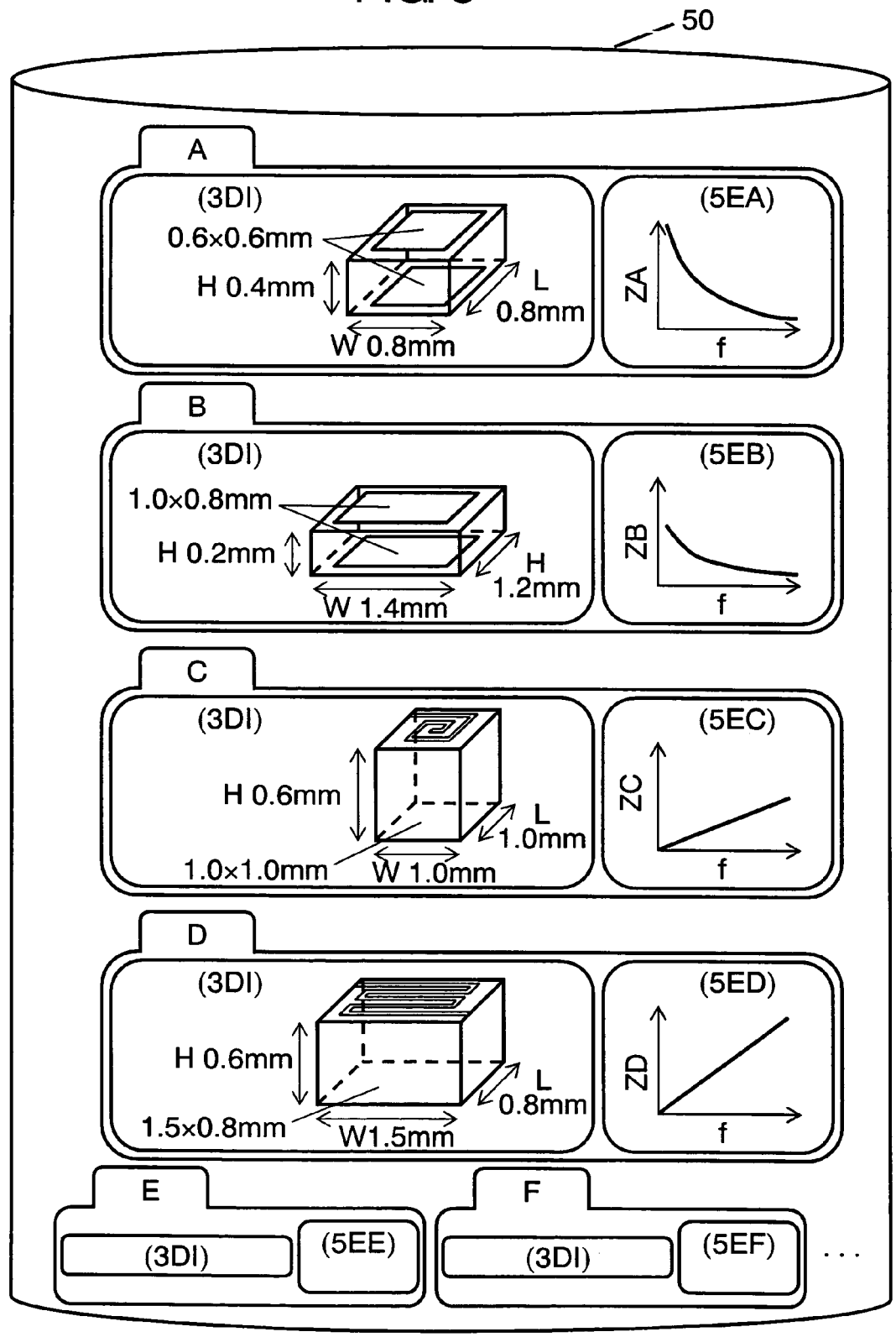
FIG. 5 is a schematic diagram of a form of a database in accordance with the exemplary embodiment.

A specific embodiment of the present invention is described hereinafter with reference to FIG. 5 and FIG. 6. FIG. 5 is a schematic diagram of a database for storing, as a pair of data, three-dimensional shape information 3DI of electronic components A through F and electrical characteristics of the electronic components that is obtained by electromagnetic analysis based on three-dimensional shape information 3DI.

FIG. 5 shows database 50. Three-dimensional shape information 3DI and various electrical characteristics of each electronic component shown below are stored in database 50, for example. Electronic component A shown in the first stage from the top in FIG. 5 is a capacitor, for example. Three-dimensional shape information 3DI of the capacitor is shown using width (W), length (L), and height (H). They are 0.8 mm, 0.8 mm, and 0.4 mm. The size of an electrode is 0.6 mm×0.6 mm. Electric characteristic 5EA of electronic component A is the characteristic of impedance ZA for frequency (f), for example, and is stored in database 50.

Electronic component B shown in the second stage from the top in FIG. 5 is a capacitor similarly to electronic component A. Three-dimensional shape information 3DI of the capacitor of electronic component B is shown using width (W), length (L), and height (H). They are 1.4 mm, 1.2 mm, and 0.2 mm. The size of an electrode is 1.0 mm×0.8 mm. Electric characteristic 5EB of electronic component B is the characteristic of impedance ZB for frequency (f). Electronic component B is selected so that its capacity is larger than that of the capacitor of electronic component A, for example. Impedance ZB of electronic component B is therefore smaller than that of electronic component A.

Electronic component C shown in the third stage from the top in FIG. 5 is an inductor. Width (W), length (L), and height (H) of electronic component C are 1.0 mm, 1.0 mm, and 0.6 mm. A spiral inductor is formed on the outermost surface. Electric characteristic 5EC of electronic component C is the characteristic of impedance ZC for frequency (f), for example, similarly to electronic components A and B.

Electronic component D shown in the fourth stage from the top in FIG. 5 is an inductor similarly to electronic component C. Width (W), length (L), and height (H) of electronic component D are 1.5 mm, 0.8 mm, and 0.6 mm. A spiral inductor is formed on the outermost surface. Electric characteristic 5ED of electronic component D is the characteristic of impedance ZD for frequency (f), for example, similarly to electronic components A, B and C, and its size is stored in database 50.

Electronic component D is selected so that its inductance is larger than that of the inductor of electronic component C, for example. Impedance of electronic component D is therefore larger than that of electronic component C.

The lowest stage in FIG. 5 shows electrical characteristics 5EE and 5EF as three-dimensional shape information 3DI of electronic components E and F extremely schematically for convenience sake. Electronic components E and F may be capacitors, inductors, or the other electronic components such as resistors.

Figure 6:
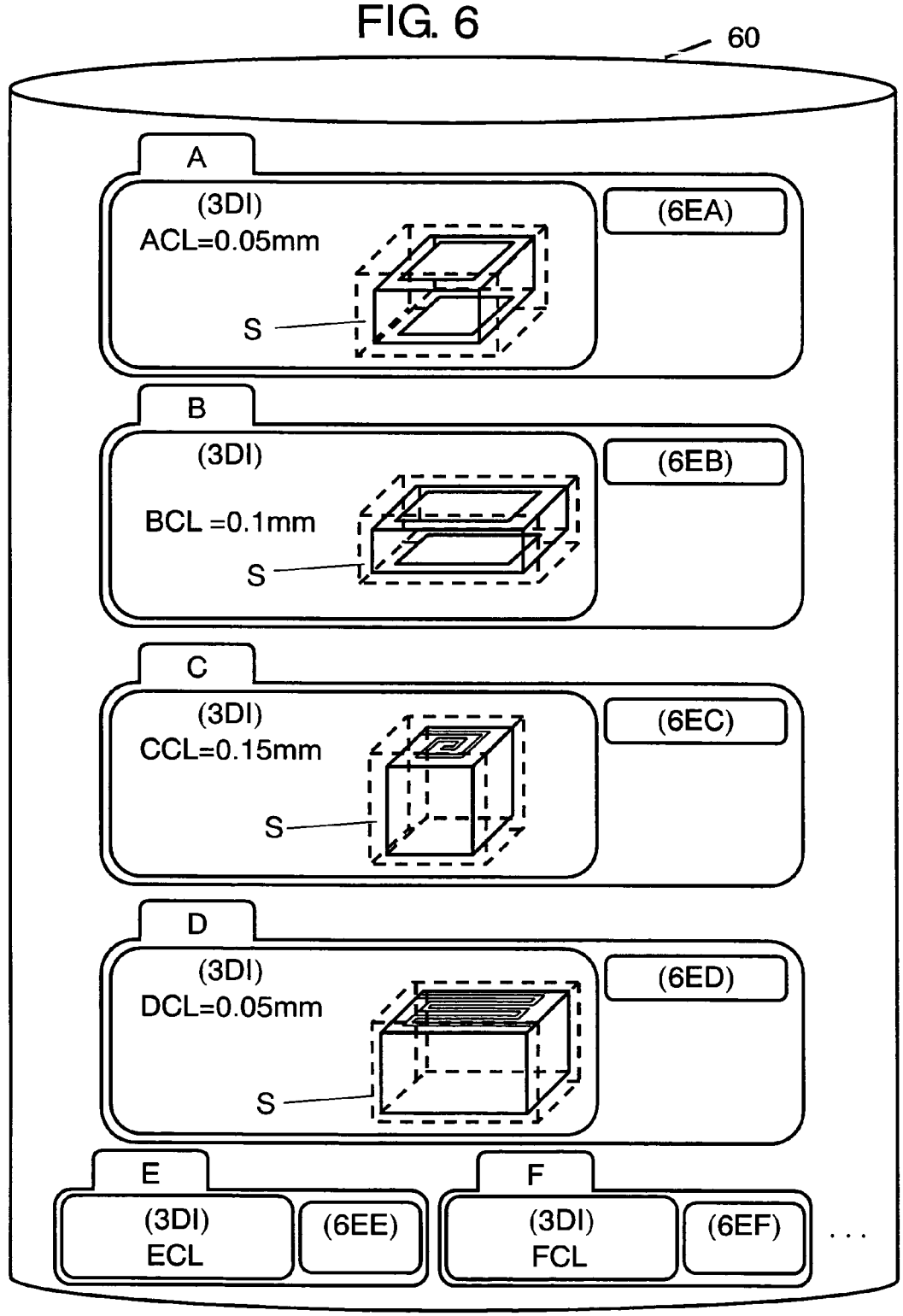
FIG. 6 is a schematic diagram of the database additionally having an allowable clearance as an attribute in accordance with the exemplary embodiment.

FIG. 6 is a schematic diagram of the database additionally having an allowable clearance as an attribute in accordance with the exemplary embodiment. In FIG. 6, the allowable clearance that determines a layout interval between each electronic component and another electronic component adjacent to it when the various electronic components are laid out on the LTCC substrate, for example, is stored as the three-dimensional shape information.

Specifically, electromagnetic analysis is performed based on three-dimensional shape information 3DI of each of electronic components A through F, and the interval between each electronic component and the adjacent electronic component at which the electric field strength is sufficiently small around the electronic components is determined as allowable clearance ACL, and is stored in the database.

In FIG. 6, allowable clearances ACL, BCL, CCL and DCL of electronic components A, B, C and D are 0.05 mm, 0.1 mm, 0.15 mm and 0.05 mm, respectively. Allowable clearances ACL through DCL can be defined as interval S (shown by broken lines) between each of electronic components A through D and its adjacent electronic component (not shown) in FIG. 6. Interval S therefore corresponds to each allowable clearance. Allowable clearances as three-dimensional shape information 3DI of electronic components E and F are not shown for convenience sake.

FIG. 6 schematically shows electrical characteristics 6EA, 6EB, 6EC, 6ED, 6EE and 6EF of electronic components A through F. These electrical characteristics may be impedances of electronic components as shown in FIG. 5, or may be other electrical characteristics such as a capacitance characteristic or an inductance characteristic.

A designing method for designing an electronic component of the present invention is described hereinafter with reference to FIG. 1 through FIG. 6. First, in step 21 of FIG. 4, a target electrical characteristic is set. Then, in step 22, for achieving this electrical characteristic, electric constants C and L of capacitor unit region 6 and inductor unit region 7

(FIG. 1) are determined using the first electric circuit simulator incorporated in CAD system 40.

Then, in step 23, a pattern shape for obtaining electric constants C and L and thickness of electronic component regions such as capacitor unit region 6 and inductor unit region 7 are determined. In determining three-dimensional shape information 3DI of such electronic components, an electronic component that has the electric constant closest to the electric constant such as C or L determined in step 22 is retrieved from database 50 shown in FIG. 5, and appropriate electronic components are selected.

Then, in step 24, layout design of laying out and directing the selected electronic components in the three-dimensional space in a module is performed. For laying out and directing the electronic components in the three-dimensional space, a two-dimensional CAD or a printed board for creating a plan view is not useful. When the three-dimensional shape information data used in the previously performed three-dimensional electric analysis is prepared for each electronic component, a three-dimensional CAD capable of making effective use of the data is useful for layout design. A conventional layout design is performed based on designers' past experience, under various constraints that electromagnetic coupling is prevented between the electronic components and the volume of the module is minimized.

When database 60 shown in FIG. 6 is used, however, the layout design can be performed while the electromagnetic coupling between the electronic components is minimized, so that the designing efficiency can be increased. After the layout design of the electronic components, the electronic components are electrically interconnected through via holes 8A, 8B and 8C and wiring patterns 9A and 9B (FIG. 1) based on the wiring information of the electrically equivalent circuits shown in FIG. 3. At this time, three-dimensional shape information 3DI responsive to via holes 8A, 8B and 8C and wiring patterns 9A and 9B, and electrical characteristics 6EA through 6EF corresponding to it, as well as the other electronic component region, are stored in database 60 shown in FIG. 6. Thus, the layout design can be advantageously performed while minimizing not only the electromagnetic coupling between the electronic components but also the electromagnetic coupling between the electronic component region, such as capacitor unit region 6 or inductor unit region 7, and via holes 8A, 8B and 8C or between the electronic component region and wiring patterns 9A and 9B.

In the procedure discussed above, three-dimensional shape information 3DI such as electrical characteristics 5EA through 5EF (6EA through 6EF) of used electronic components A through F, the number of via holes 8A, 8B and 8C, and the length of wiring patterns 9A and 9B is determined. Therefore, the second electric circuit simulation considering them can be performed in step 25. The second electric circuit simulation is incorporated in CAD system 40.

Finally, in step 26, the electrical characteristic of the actually produced module is measured, and it is determined whether it matches with the predetermined electrical characteristic as the target.

In this designing method of the present invention, the second electric circuit simulation considering three-dimensional shape information 3DI can be performed in step 25 (FIG. 4). Therefore, an accurate electrical characteristic can be obtained, simulation does not need to be repeated many times, and hence the designing efficiency can be increased. Adding the electric circuit simulation function to CAD system 40 allows repetition of these procedures in the same system and hence increases the designing efficiency.

Further, when layout design 24 is performed using database 60 of FIG. 6, simulation does not need to be repeated many times, the design can be performed always considering the electromagnetic coupling, and hence the designing efficiency is increased The present embodiment has been described using an LTCC substrate as the substrate material, an HPF as the circuit, and frequency and impedance as the electrical characteristics. However, another dielectric material may be used as the substrate material, and another characteristic such as a band pass filter may be used as the electrical characteristic.

INDUSTRIAL APPLICABILITY

A designing method of an electronic component of the present invention has an advantage of increasing the designing efficiency, and is useful especially in a CAD system for designing a multilayer circuit component. Its industrial applicability is therefore high.

The invention claimed is:

1. A designing method for designing an electronic component, comprising:
   a first step of setting a predetermined electrical characteristic of the electronic component;
   a second step of determining an electric constant of the electronic component with a first electric circuit simulation so as to satisfy the predetermined electrical characteristic;
   a third step of determining a pattern shape for obtaining the determined electric constant;
   a fourth step of retrieving and selecting an electronic component matching with the determined electric constant from a database, and performing a layout design using the selected electronic component as a module;
   a fifth step of performing a second electric circuit simulation after the fourth step of performing the layout design; and
   a sixth step of determining whether an electrical characteristic of the module matches with the predetermined electrical characteristic,
   wherein
   three-dimensional shape information
   and electrical characteristics of the selected electronic component, three-dimensional information on allowable clearance defining a layout interval between the selected electronic component and another adjacent electronic component adjacent to it when they are laid out, and three-dimensional shape information on a wiring pattern and a via hole that connect the two adjacent electronic components to other electronic components are stored in the database.

2. The designing method of claim 1, wherein
   processes of the third step and later are performed after a process of the fifth step is performed.

3. The designing method of claim 1, wherein
   processes of the third step and later are performed after a process of the sixth step is performed.

4. The designing method of claim 1, wherein
   processes of the second, third, fourth, and fifth steps are performed by the same CAD system.

5. The designing method of claim 1, wherein
   the electronic component is formed on a low-temperature fired ceramic substrate.

6. The designing method of claim 5, wherein
   the electronic component includes at least one of a capacitor, an inductor, and a resistor.

7. The designing method of claim 5, wherein
   the low-temperature fired ceramic substrate is a multilayer circuit board.

* * * * *